(12) United States Patent
Zhang

(10) Patent No.: US 11,281,825 B2
(45) Date of Patent: Mar. 22, 2022

(54) COMPUTER-IMPLEMENTED METHOD FOR HIGH SPEED MULTI-SOURCE LOADING AND RETRIEVAL OF WAVEFIELDS EMPLOYING FINITE DIFFERENCE MODELS

(71) Applicants: China Petroleum & Chemical Corporation, Beijing (CN); Sinopec Tech Houston, Houston, TX (US)

(72) Inventor: Changhua Zhang, Houston, TX (US)

(73) Assignee: CHINA PETROLEUM & CHEMICAL CORPORATION, Beijing (CN)

( * ) Notice: Subject to any disclaimer, the term of this patent is extended or adjusted under 35 U.S.C. 154(b) by 35 days.

(21) Appl. No.: 16/917,545

(22) Filed: Jun. 30, 2020

(65) Prior Publication Data
US 2021/0406427 A1   Dec. 30, 2021

(51) Int. Cl.
*G06F 30/23* (2020.01)
*G01V 99/00* (2009.01)

(52) U.S. Cl.
CPC ............ *G06F 30/23* (2020.01); *G01V 99/005* (2013.01); *G01V 2210/6248* (2013.01); *G01V 2210/679* (2013.01)

(58) Field of Classification Search
CPC .............. G06F 30/23; G01V 99/005; G01V 2210/6248; G01V 2210/679
USPC ...................................... 703/2, 10
See application file for complete search history.

(56) References Cited

U.S. PATENT DOCUMENTS

| 8,549,500 | B2 | 10/2013 | Stefansson | |
|---|---|---|---|---|
| 9,995,835 | B2 | 6/2018 | Johnsen | |
| 10,678,553 | B2 | 6/2020 | Patil | |
| 2005/0090987 | A1 | 4/2005 | Amundsen | |
| 2019/0302290 | A1* | 10/2019 | Alwon | ................ G01V 1/282 |

FOREIGN PATENT DOCUMENTS

| CN | 104570080 | A | * | 4/2015 |
|---|---|---|---|---|
| CN | 104570081 | A | * | 4/2015 |
| CN | 105319581 | A | * | 2/2016 |
| CN | 105717539 | A | * | 6/2016 |

OTHER PUBLICATIONS

Yang, Pengliang, Jinghuai Gao, and Baoli Wang. "RTM using effective boundary saving: A staggered grid GPU implementation." Computers & Geosciences 68 (2014). pp. 64-72. (Year: 2014).*

(Continued)

*Primary Examiner* — Kamini S Shah
*Assistant Examiner* — John E Johansen
(74) *Attorney, Agent, or Firm* — Novick, Kim & Lee, PLLC; Allen Xue

(57) ABSTRACT

A method for efficiently injecting sources and retrieving receiver wavefields using finite difference models for wavefield simulations on a GPU, when the source and receiver are not on numerical grid points, and therefore arbitrarily located. To accomplish that, the method employs GPU texture memory to increase the memory read bandwidth, and then positions at arbitrary or simulated locations the sources in a finite difference grid, as well as extends them over a newly generated number of grid points.

17 Claims, 5 Drawing Sheets

(56) References Cited

OTHER PUBLICATIONS

Wang, Yufeng, et al. "Cu Q-RTM: A CUDA-based code package for stable and efficient Q-compensated reverse time migration." Geophysics 84.1 (2019). pp. F1-F15. (Year: 2019).*
Ke, Xuan, Ying Shi, and W. H. Wang. "An efficient wavefield simulation and reconstruction method for least-squares reverse time migration." Journal of Seismic Exploration 27.2 (2018). pp. 183-200. (Year: 2018).*
Tan, Sirui, and Lianjie Huang. "Reducing the computer memory requirement for 3D reverse-time migration with a boundary-wavefield extrapolation method." Geophysics 79.5 (2014). pp. S185-S194 (Year: 2014).*
Nader Moussa; Seismic imaging using GPGPU accelerated reverse time migration, Jan. 2009, SEP-138, pp. 1-14.
Robert G. Clapp; Reverse time migration : Saving the boundaries, 2009, SEP-136, pp. 1-8.
Javier Cabezas, Mauricio Araya-Poloy, Isaac Geladoz, Nacho Navarroz, Enric Moranchoz, Jose M Celayz; High-Performance Reverse Time Migration on GPU, Computer Sciences—Programming Models Barcelona Supercomputing Center (BSC), Barcelona, Spain, Nov. 2009, pp. 1-10.
Ravish Mehraa, Nikunj Raghuvanshib, Lauri Saviojac, Ming C. Lina, Dinesh Manochaa; Efficient GPU-Based Solver for Acoustic Wave Equation, Applied Acoustics, vol. 73, Issue 2, Feb. 2012, pp. 83-94.
Pengliang, Yang, Jinghuai, Gao, Baoli, Wang; RTM using effective boundary saving: A staggered grid GPU implementation, Published in Computers & Geosciences, vol. 68, pp. 64-72, (2014).
Pengliang, Yang, Jinghuai, Gao, Baoli, Wangy; A graphics processing unit implementation of time-domain full-waveform inversion, Published in Geophysics, vol. 80, No. 3, pp. F31-F39, (2015).
Jian, Mao, Ru-Shan, Wu; Multiscale full waveform inversion using GPU, SEG Las Vegas 2012 Annual Meeting, Published 2016, pp. 1-7.

\* cited by examiner

COMPUTER-IMPLEMENTED METHOD FOR HIGH SPEED MULTI-SOURCE LOADING AND RETRIEVAL OF WAVEFIELDS EMPLOYING FINITE DIFFERENCE MODELS

TECHNICAL FIELD

The present disclosure relates generally to geophysical prospecting, and seismic data processing using high-speed computational methods employing finite different models in graphical processing units with bandwidth and memory limitations.

BACKGROUND OF INVENTION

1. Overview

There may not be enough computational capacity even with today's high-performance computing, to model an entire domain of a survey with a single unified computational scheme. Therefore, persons skilled in the art will turn to the utilization of hybrid processing units to achieve high-level numerical programming solutions. These hybrid approaches require efficient and practical implementations, as several different modeling kernels of these units, operate in different regions (or subdomains) of the seismic survey model, and possibly even at different finite-difference grid resolutions.

The two main processing units are Graphical processing units (GPUs) and central processing units (CPUs). GPUs provide high performance computational capabilities at lower prices than comparable CPUs, as well as come in a variety of hardware modules like desktop, or centers. GPUs main purpose is to provide improved numerical performance, and therefore the performance between GPUs and CPUs, is significantly different. For instance, one particular GPU can compute one trillion floating point operations in a single second (i.e., one teraflop), while a CPU's performance is given by the number of cores per socket (e.g. 4-core), and the performance of said sockets (i.e. number of clock cycles per second).

Nevertheless, GPUs rely on thread-level parallelism to hide long off-chip memory access latency, judicious utilization of on-chip memory resources, including register files, shared memory, and data caches, is critical to application performance. In contrast, an on-chip characteristic of GPUs is that they can address in parallel their different on-chip memory, thereby increasing the memory bandwidth, and latency. As such, managing GPU on-chip memory resources is a non-trivial task for application developers. More importantly, as on-chip memory resources vary among different GPU generations, performance portability has become a daunting challenge. However, it is well known in the art that a GPU provides very limited support for general-purpose programming as the code being executing in the GPU cannot self-allocate memory and requires this to be accomplished by host CPU.

These complexities of using hybrid approaches, mean that programming from a CPU to a GPU is difficult and requires a high level of algorithms to be generated at either the same or different times. Clearly this hinders the amount of work that a person skilled in the art can perform in the oil and gas industry when computing large-scale seismic wave equation modeling in complex media, and seismic wave propagation simulations.

2. Current Stage of GPU Architectures

One of the most widely use high-performance parallel applications in the C/C++ language, using the Compute Unified Device Architecture (CUDA) programming model, has been NVIDIA's Tesla architecture. An example of NVIDIAs architecture typically presents a set of streaming multiprocessors, each with its own processors and shared memory (user-managed cache). The processors are fully capable of executing integer and single precision floating point arithmetic, with additional cores used for double-precision. However, all the stream processors in a multiprocessor share the fetch, control and memory units with the global device memory not cached by the hardware.

In these architectures, CUDA arranges threads into thread-blocks, that can read and write in any shared memory location, assigned to said thread-block. Consequently, threads within a thread-block can communicate via shared memory or use shared memory as a user-managed cache since shared memory latency is two orders of magnitude lower than that of global memory.

However, because in most architectures, the forward and backward phases, access and modify the same data, a mixed CPU/GPU implementation requires continuous memory transfers between the host and the GPU memories in order to keep the data coherent. Because of frequent and large memory transfers, current GPU performance is hugely penalized, and steps are then performed in GPU kernels that access data which resides in a Graphics Double Data Rate (GDDRAM) module. This provides an additional benefit as GDDR modules, can request and receive data on the same clock cycle. Therefore, the host is left only to compute the execution environment, the kernels' invocations, and the I/O transfers to/from disk whenever it is necessary.

3. Acoustic Wave Propagation

Computational modeling for acoustic waves has been an area of active research, and has evolved from fields like aerospace to seismology, geophysics and even meteorology. In fact, computational modeling, and simulation of acoustic waves in space arrays is fundamental in many scientific and engineering applications, but in oil and gas shell and reservoir exploration. Nevertheless, achieving good results from acoustic wave propagation models, in large or complex structures to-date still remains a major computational challenge.

The most common approach used in the field to simulate acoustic wave propagation, generally comprises a two-stage process: (1) computing impulse responses representing an acoustic space, and (2) convolving of the impulse responses with anechoically recorded or synthetically generated, source signals. Yet, because these impulse responses rely on an accurate calculation for modeling the time varying spatial sound field, their key challenge it still is the computational requirements of an accurate solver method (e.g. finite difference). In most cases, the methods used to solve acoustic wave propagation matters, require from the spatial discretization approximately 3-5 nodes (i.e. gridpoints) per wavelength. Assuming a minimum frequency range of 3 Hz, and a maximum frequency of 100 Hz with a node spacing of 5-50 m, the result is ten cubic kilometers of acoustic space filled with about 8-8000 million nodes. As a result, numerical solvers for the acoustic wave equation are limited to rather simple, constrained, or small spaces which are often regarded as time-consuming. To overcome this, most current acoustic simulation systems use geometric acoustic techniques, which are only accurate for higher frequencies and early reflections and may not be able to model the diffraction effects. As it can be observed, the overcoming of one problem, creates a different one.

4. Full Wavefield Inversion (FWI)

FWI is a partial-differential-equation-constrained optimization method which iteratively minimizes a norm of the misfit between measured and computed wavefields. Seismic FWI involves multiple iterations, and a single iteration can involve the following computations: (1) solution of the forward equations, (2) solution of the adjoint equations, and (3) convolutions of these forward and adjoint solutions to yield a gradient of the cost function. Note that for second-order optimization methods, such as Gauss-Newton, the (4) solution of the perturbed forward equations is also required.

The classical time-domain FWI was originally proposed by Tarantola in 1984, to refine the velocity model by minimizing the energy in the difference between predicted and observed data in the least-squares sense (See Tarantola, A., 1984, *Inversion of seismic reflection data in the acoustic approximation*, Geophysics, 49, 1259-1266, and also Symes, W. W., 2008, *Migration velocity analysis and waveform inversion*, Geophysical Prospecting, 56, 765-790). It was further developed by Tarantola in 1986 m with applications to elastic cases (See Pica, A., J. Diet, and A. Tarantola, 1990, *Nonlinear inversion of seismic reflection data in a laterally invariant medium*, Geophysics, 55, 284-292). Thereafter, frequency domain FWI became an area of active research, and provided a hierarchical framework for robust inversion (See Pratt, G., C. Shin, et al., 1998, *Gauss-newton and full newton methods in frequency-space seismic waveform inversion*, Geophysical Journal International, 133, 341-362). Most recently the Laplace-domain FWI and the Laplace-Fourier-domain variant were introduced by Shin and Cha (See Shin, C., and Y. H. Cha, 2008, *Waveform inversion in the Laplace domain*, Geophysical Journal International, 173, 922-931, 2009; and also *Waveform inversion in the Laplace-Fourier domain*, Geophysical Journal International, 177, 1067-1079); but it is still a challenging problem and attracts increasing effort of geophysicists (See Virieux, J., and S. Operto, 2009, *An overview of full-waveform inversion in exploration geophysics*, Geophysics, 74, WCC1-WCC26).

Nevertheless, recent advances in computing capability and hardware through the utilization of GPUs, made of the FWI method a widely used one in order to mitigate the computational drawbacks in seismic imaging (See Micikevicius, P., 2009, 3*D finite difference computation on GPUs using CUDA: Proceedings of 2nd Workshop on General Purpose Processing on Graphics Processing Units*, ACM, 79-84) and inversion (See Boonyasiriwat, C., G. Zhan, M. Hadwiger, M. Srinivasan, and G. Schuster, 2010, *Multi-source reverse-time migration and full-waveform inversion on a GPGPU*, Presented at the 72nd EAGE Conference & Exhibition). However, one key problem for GPU computation still exists and it does not necessarily have to do with the computation resources of the GPU, but rather with the communication time for the transmission of data between the host and the client, as well as their memory resources.

5. Reverse Time Migration (RTM)

Reverse Time Migration is a seismic imaging migration method well-known in the art, and it is primarily used to map the sub-surface reflectivity using recorded seismic waveforms. RTM is able to handle the most severe combinations of structural dips with high velocity contrast, conditions common in salt basins and other geologic basins with complex structures and velocity distributions. These sub-surface conditions severely distort any propagating wave fronts and images, therefore complicating the modeling and imaging of seismic data. As such, in these types of conditions, it is required to shoot from multiple sources thereby creating a wide array of wavefield-types to be captured by sensors.

Another advantage of the RTM method includes evaluating the quality of an image at the same space locality, as where the forming the images occurred. Considering that most seismic migration applications today still use primary reflection as the only signal, the capability of RTM to use all computable wave types is unique and helpful reducing the imaging artifacts due to mistaking non-primary waves as primary reflections.

The basic idea of RTM is a three-step procedure of (1) forward-modelling a wavefield through an appropriate velocity model, (b) reversely propagating the measured data through the very same model, and (c) super-positioning both using an imaging condition. The complete wave equation is used for the simulation. There are no dip restrictions for imaging because the entire wavefield including multiple reflections is used. Thus, even vertical boundaries or lower edges of objects can be imaged.

In most situations, RTM methods seek an initial image of the subsurface reflectivity as the best match in an image space, between the extrapolation of time-reversed waveform data and the simulated prediction, based on an estimated velocity model and source parameters. In mathematically terms, the RTM method basically extrapolates an initially zero x-y-z volume backwards in time, bringing in the seismic data $P(x,y,z=0,t)$ as a boundary condition of $z=0$ at each time step to compute snapshots of the x-y-z volume at different times. At time $t=0$, this x-y-z volume generates the migration results of image $I(x,y,z)$ 6. Finite Difference Model The finite difference model is an approach widely used in the oil and gas industry for large-scale seismic wave equation modeling in complex media, and seismic wave propagation simulation for both, modeling for synthetic data and migration (such as reverse time migration) or inversion such as, full waveform inversion). In this model, the time evolution of the seismic wavefield is sampled on a volume of discretized grid points. However, the excitation or the recorded wavefield of such a wavefield are not necessary on these grid points.

Common commercial applications include reference synthetic seismic data generation, reverse time migration and full waveform inversion. Commercial finite-difference modelers typically solve acoustic or anisotropic pseudo-acoustic wave equations in schemes that apply a common kernel across the model domain. These schemes are usually highly optimized, and include load balancing, which is needed to account for the additional cost of absorbing boundary regions in some domains. Nevertheless, computing hardware availability is leading to larger and increasingly heterogeneous cluster environments from a survey region. This is partly because the pace of change in multi-core CPUs is rapid enough, that clusters typically contain nodes spanning several generations of CPU technology, and also due to the emergence of mixed CPU and GPU clusters, as well as hybrid cores. As such, this non-uniformity of computing nodes makes load balancing more difficult to achieve.

However, when employing the finite difference model, the cost of the memory access, regardless if it is on a CPU or a GPU, is generally the bottleneck in performance. For example, for numerical calculations of the first-order spatial derivative $$\frac{\partial f}{\partial x}$$

at a grid point i for the wavefield f, N+1, values of f must be loaded from the computer memory, leading to a N+1:1 read-to-computing ratio, where N is the order of the finite difference. Therefore, reducing the number of memory accesses or increasing the bandwidth of memory reading/writing is fundamentally important for the efficiency of the finite-difference method.

When an excitation source point is on the finite difference grid point, only one read and one write memory access are needed for injecting one such a source. However, when the source location is not on the grid point, one must find a combination of grid point sources that are equivalent to the source located off the grid point. This effective number of grid point sources is typically $n_x n_y n_z$, where $n_{x(y,z)}$ is the number of grid points from the source location in x(y,z) direction and is usually taken the same value of half the finite difference order N required by accuracy. Therefore, for $16^{th}$ order finite difference, if $$n_{x(y,z)} = \frac{N}{2} = 8,$$

the number of combined grid point sources is up to 512. More importantly, these grid points are not in the contiguous memory and the memory access cost increases at least $n_x n_y n_z$ times. In the reverse rime migration (RTM) or in the full waveform inversion (FWI), the data become the sources during the backward wave propagation. In this case, the number of effective grid point sources is $n_x n_y n_z N_x N_y$, where $N_x$ and $N_y$ are the number of receivers in x- and y-direction, respectively. Similarly, for retrieving the wavefield at an arbitrary location, one needs combination of wavefield values on $n_x n_y n_z$ grid points.

On the GPU, the off-chip global memory access is very expansive compared to cashed on-chip memory access. Therefore, how to increase the bandwidth for the source loading or wavefield retrieving on GPU has significant impact on the performance of the finite difference code when the source or receivers are not on the grid points.

Due to the foregoing, it is desirable to find a better way to increase the bandwidth for the source loading or wavefield retrieving process, on a GPU the computation load among available computer resources.

SUMMARY OF THE INVENTION

The present invention therefore, meets the above needs and overcomes one or more deficiencies in the prior art by providing a computer-implemented method for high speed multi-source loading and retrieval of wavefields employing finite difference models.

In general, according to an embodiment of the present disclosure, spatial locality indicates that a thread is likely to read spatially, other nearby threads' memory addresses. In the finite difference scheme however, a GPU thread, is only mapped to handle a grid point. Similarly, a thread used to source-load expression (4) or a wavefield-retrieve expression (5), will only access its nearby threads' memories. If the memories of the aforementioned examples are on the off-chip global memory resource, such accesses become a costly operation to perform. Therefore, by using the texture memory according to an embodiment of the present disclosure, a thread can read from memory addresses nearby at higher bandwidth, thus greatly reducing the loading and retrieving time by a factor of 10.

According to an embodiment of the present invention, the sequence of steps for fast multi-sources loading at arbitrary location in the finite difference method on GPU typically include: 1) determining the effective number of the combined gridpoint sources for each actual source using $n_{x(y,z)}$, wherein $n_{x(y,z)}$ usually takes $$\frac{N}{2},$$

N in the finite difference order; 2) treating each effective gridpoint sources term as independent point source with a weight; 3) allocating the independent grid-point source grid positions, weigh and as well as the wavefield variable on the off-chip global memories; 4) Mapping those global memories to texture memories; 5) Using CUDA programmed texture memory fetch functions and APIs to read the grid point source grid positions, the field values and weights on these gridpoints; and 6) loading the grid point source with a weight on the field for that grid site.

Similarly, another embodiment of the present disclosure entails the sequence of steps for fast wavefield retrieving at arbitrary locations using the finite difference method on a GPU. This sequence typically includes: 1) Determining the effective number of the combined gridpoints for each receiver using $n_{x(y,z)}$, wherein $n_{x(y,z)}$ usually takes $$\frac{N}{2},$$

N in the finite different order; 2) calculating the contribution weight; 3) allocating these gridpoint positions, weights and wavefield variables on an off-chip global memory resource of the GPU; 4) mapping those global memories to texture memories; 5) using CUDA texture memory fetch functions and processes to read the field on these grid point and weight, and 6) adding the weighted wavefields to obtain the retrieved wavefield.

Finally, although the embodiments herewith disclosed, described a multi-source injection and wavefield retrieving method and system, in wave propagation utilizing finite-difference approximation of the scalar acoustic wave equation, it would be apparent to a person having ordinary skills in the art that they can also be alternative applied to vector wave equations, and elastic equations, in both isotropic and anisotropic media, without departing from the true scope of the invention, as defined in the claims set forth below.

Symbols Table

| Symbol | Brief Definition |
| --- | --- |
| $V_P$ | Acoustic velocity model |
| $P(\vec{r}, \vec{r}_s; t)$ | Wavefield at location $\vec{r}$ and time t excited by a source at $\vec{r}_s$ |
| f | An arbitrary function |
| x(y, z) | x, y, z coordinates for source and receiver points |
| N | Finite difference order |
| $n_{x(y, z)}$ | Effect source gridpoints in x, y, and z direction |
| $N_{x(y, z)}$ | Number of gridpoints in x, y, and z direction |
| $N_t$ | Number of time steps |
| $\vec{r}_s$ | Source location |
| $\vec{r}_r$ | Receiver location |
| $\Delta x (\Delta y, \Delta z)$ | Finite difference grid step length |
| $i_s, j_s, k_s$ | Three-dimensional nearest grid point for a source at $\vec{r}_s$ |
| $i_r, j_r, k_r$ | Three-dimensional nearest grid point for a receiver at $\vec{r}_r$ |
| i, j, k | Three-dimensional finite difference grid point |
| $w_{i_s+i}(x_s)$ | Source weight on a gridpoint, where i points away from $i_s$ in x-direction |
| $w_{j_s+j}(y_s)$ | Source weight on a gridpoint, where j points away from $j_s$ in y-direction |
| $w_{k_s+k}(z_s)$ | Source weight on a gridpoint, where k points away from $k_s$ in z-direction |
| $w_{i_r+i}(x_r)$ | Weigh of the wavefield on a gridpoint, where i points away from $i_r$ in x-direction to wavefield on receiver at $x_r$. |
| $w_{j_r+j}(y_r)$ | Weigh of the wavefield on a gridpoint, where i points away from $j_r$ in y-direction to wavefield on receiver at $y_r$. |
| $w_{k_r+k}(z_r)$ | Weigh of the wavefield on a gridpoint, where k points away from $k_r$ in z-direction to wavefield on receiver at $z_r$. |
| W(x) | A window function |
| $I_0$ | Zero-order modified Bessel function |
| b | A shape control parameter for the window function W(x) |
| $S_{i,j,k}^n$ | Effective source at time step n on the grid point i, j, k |
| $P_{i,j,k}^n$ | Wavefield at time step n on the grid point i, j, k |
| $R(x_r, y_r, z_r, n)$ | Wavefield at time step n recorded by a receiver located at $x_r, y_r, z_r$. |
| int | A function take the smallest integer |
| $\nabla^2$ | Laplacian operator |
| s(t) | Source wavelet |
| t | time |
| $\partial$ | Partial derivative operator |
| $\delta(\vec{r} - \vec{r}_s)$ | Dirac delta function |
| $\vec{r}$ | Spatial location vector |

BRIEF DESCRIPTION OF THE DRAWINGS

The teachings of the present invention can be readily understood by considering the following description in conjunction with the accompanying drawings.

DETAILED DESCRIPTION OF THE INVENTION

Figure 1:
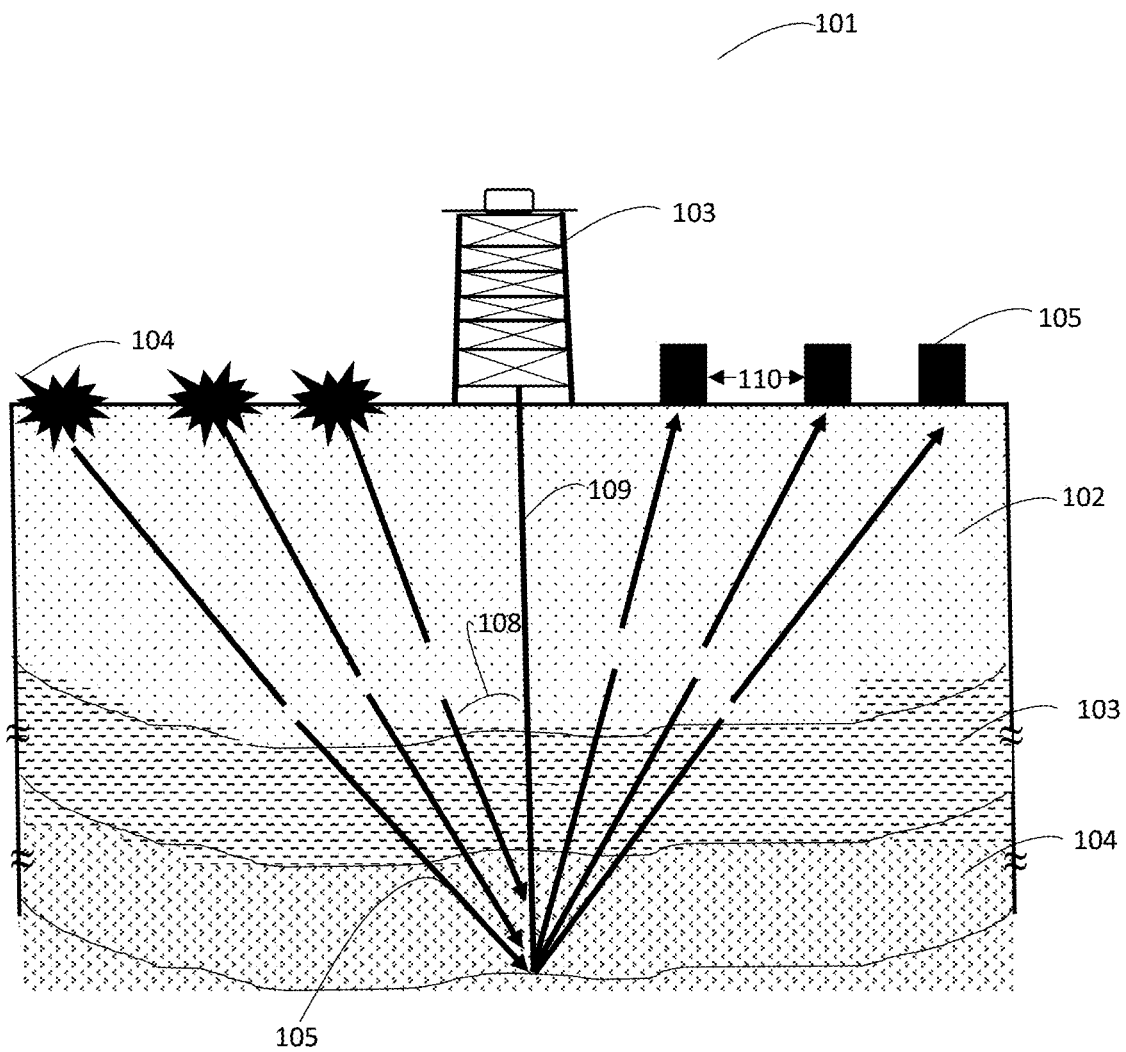
FIG. 1, is a schematic diagram showing a cross-sectional view of an illustrative environment with points of incidence of seismic sources, seismic receivers, a well location, a wellbore, the various transmission rays, and the various angles of incidence, according to certain embodiments of the present disclosure.

Reference will now be made in detail, to several embodiments of the present disclosures, examples of which, are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures, systems, and methods illustrated herein may be employed without departing from the principles of the disclosure described herein.

The computer-implemented method of the present invention, introduces an efficient way to inject sources, and to retrieve wavefields using in finite difference for wavefield simulation on the GPU when the source or receiver are not on numerical gridpoints. In the present state of the art, memory access is a bottleneck when comparing to computation instructions. Furthermore, when sources are positioned at arbitrary locations in a finite difference grid, they must be extended on a number of grid points, thereby effectively increasing the number of source points to inject into the simulation. As these extended gridpoints are often not located in a contiguous memory region, this greatly increase the memory access cost, yet when the actual number sources are a few, the increased memory access cost is limited. But when performing reverse time migration (RTM) or full waveform inversion (FWI), the number of actual sources during backward wave simulations, is equal to the number of data traces, thereby significantly increasing memory access costs. Similarly, in a forward wave simulation, when receivers are not on the grid points, the wavefield recorded at the receivers must be obtained from its neighbor grid points. In one of the present embodiments of the present invention, the computer-implemented method aims to overcome these memory access costs, by using GPU texture memory. Even though a GPU thread for source injection or wavefield retrieving will have to read noncontiguous memory, memory access patterns exhibit a great deal of spatial locality. In a computing application, this roughly implies that a thread is likely to read from an address "near" the address that nearby threads read. GPU texture memory is designed to increase the effective bandwidth of this spatial locality memory read. Using this texture memory, the efficiency of the source injection and wavefield retrieving can improve by ten times.

1. Deployment of a Technique to Increase GPU Bandwidth

In order to compute an acoustic wave propagation equation by the present computer-implemented method, the following algorithm was developed in simplified form:

$$\frac{1}{V_P^2}\frac{\partial^2 P(\vec{r},\vec{r}_s;t)}{\partial t^2} = \nabla^2 P(\vec{r},\vec{r}_s;t) + s(t)\delta(\vec{r}-\vec{r}_s), \quad (1)$$

where, $V_P$ is the acoustic wave velocity, $P(\vec{r},\vec{r}_s;t)$ is the pressure wavefield at $(\vec{r},t)$ due to the point excitation at $\vec{r}_s$, and $s(t)$ is the source time wavelet.

In the finite difference numerical solution, equation (1) is discretized in space and time, with grids sizes $(N_x,N_y,N_z,N_t)$ in X, Y, Z and t dimension respectively. Nevertheless, the pressure wavefield only has values on these gridpoints: $P_{i,j,k=(1,1,1),\ldots,(N_x,N_y,N_z)}^{n=1,\ldots,N_t}$. As such, and in this finite difference model for $P_{i,j,k=(1,1,1),\ldots,(N_x,N_y,N_z)}^{n=1,\ldots,N_t}$ the computation of reads and writes from, and to a memory resource are always the bottleneck.

When the source location $\vec{r}_s$ is on a grid point $(i_s,j_s,k_s)$, the source loading at time-step value n in the finite difference model is simply computed as:

$$P_{i_s,j_s,k_s}^n \rightarrow P_{i_s,j_s,k_s}^n + S_{i_s,j_s,k_s}^n \quad (2)$$

The memory cost of this source loading is simply one-read and one-write the in-memory resource, for each source. As such, most individuals skilled in the art ignore this cost, when compared to other operations.

A. When Receiver Location is on Grid Point

On the other hand, when the receiver location $\vec{r}_r$ is on the grid point $(i_r,j_r,k_r)$, the pressure wavefield $R_{i_r,j_r,k_r}^n$ recorded by this receiver at time-step value n is simply retrieved as:

$$R_{i_r,j_r,k_r}^n = P_{i_r,j_r,k_r}^n. \quad (3)$$

Nevertheless, the memory cost of this retrieving process is simply one-read, and one-write in memory for each receiver. As such, most individuals skilled in the art, also ignore this cost when compared to other operations.

However, when the source point $\vec{r}_s=(x_s,y_s,z_s)$ is not on a finite difference grid site, one must find a set of grid points sources (i,j,k) that are combined to be equivalent to the source located at $\vec{r}_s$. As such, the following equation must be implemented:

$$S_{i_s+i,j_s+j,k_s+k}^n(x_s,y_s,z_s) = s(t)w_{i_s+i}(x_s)w_{j_s+j}(y_s)w_{k_s+k}(z_s) \quad (4)$$

where $$i_s = int\left(\frac{x_s}{\Delta x}\right), j_s = int\left(\frac{y_s}{\Delta y}\right), \text{ and } k_s = int\left(\frac{z_s}{\Delta z}\right),$$

and $w_{i_s+i}(x_s)$, $w_{j_s+j}(y_s)$, and $w_{k_s+k}(z_s)$ are the nearest gridpoints for any off-grid source, $w_{i_s+i}(x_s)$, $w_{j_s+j}(y_s)$, and $w_{k_s+k}(z_s)$ the weighing functions, and $\Delta x(\Delta y,\Delta z)$ is the grid step in x(y,z)-direction.

In theory, the set of grid-points sources (i,j,k) for each actual point-source are typically extended to all over the spatial grid space. Each grid-point source from expression (4) is then loaded according to expression (2), which significantly increases the cost. However, in practice, because of accuracy considerations; a windowed grid-point-source of equation (4) is used, such that for each point-source at $\vec{r}_s$ one uses: $-n_x/2+1 \leq i \leq n_x/2$, $-n_y/2+1 \leq j \leq n_y/2$, $-n_z/2+1 \leq k \leq n_z/2$ set of grid-point-sources. The effective number of gridpoint-sources following the aforementioned, is therefore $n_x n_y n_z$. One again, for accuracy considerations, in practice, $2n_{x(y,z)}$ is usually taken in the order of the finite difference operator N therefore, for a $16^{th}$-order finite difference $n_{x(y,z)}=8$, the effective number of combined grid-point-source terms ends up being of up to 512, clearly increasing the loading cost by 512 times. Furthermore, since for each point-source, the extended gridpoints: $-n_x/2+1 \leq i \leq n_x/2$, $-n_y/2+1 \leq j \leq n_y/2$, $-n_z/2+1 \leq k \leq n_z/2$, are not in contiguous memory resources, the memory access cost is also further increased. This increased memory access cost, becomes even worse in the backward wave simulation stage for RTM or FWI because there are $N_x N_y$ actual point-sources, and the number of extended grid point-sources becomes $n_x n_y n_z N_x N_y$.

B. When Receiver Location is not on Grid Point

Similarly, when the receiver $\vec{r}_r=(x_r,y_r,z_r)$ is not on the finite difference grid site, one must find a set of grid point wavefield terms (i,j,k) that are combined to obtain the wavefield located at $\vec{r}_r$, using the following expression:

$$R(x_r,y_r,z_r,n) = \Sigma_{(i,j,k)=-n_{x,y,z}/2+1}^{n_{x,y,z}/2} P_{i_r+i,j_r+j,k_r+k}^n w_{i_r+i}(x_r) w_{j_r+j}(y_r) w_{k_r+k}(z_r) \quad (5)$$

Under expression (5), wavefield $R(x_r,y_r,z_r,n)$ at the receiver is combined with the $n_x n_y n_z$ grid-point wave field values of $P_{i_r+i,j_r+j,k_r+k}^n$ which are scattered into the noncontiguous memory grid-points: $-n_x/2+1 \leq i \leq n_x/2$, $-n_y/2+1 \leq j \leq n_y/2$, $-n_z/2+1 \leq k \leq n_z/2$, therefore also leading to expensive memory access cost.

Although gridpoints: $-n_x/2+1 \leq i \leq n_x/2$, $-n_y/2+1 \leq j \leq n_y/2$, $-n_z/2+1 \leq k \leq n_z/2$, are needed for source loading or wavefield retrieving in situations when the source or the receivers are not on the grid-points, or on contiguous area in a computer memory; they can still be spatially located, if one extends the grid-points, from the source or the receiver position. This can be achieved via the texture cached memory on the GPU, which was originally designed for graphics applications, where memory access patterns exhibit a great deal of spatial locality with about 10 times higher effective read and write bandwidth than the read of the off-chip global memory.

Further this texture memory can also be used for general-purpose computing but thus far none have been exploited.

2. Loading or Injection of Sources or Points of Incidence

In general terms, the sequence of steps presented in one of the embodiments of the inventions for fast multi-sources injection at arbitrary location in the finite difference method on GPU includes:

a) Determining the effective number of the combined gridpoint sources for each actual source. When the source point i=$(x_s,y_s,z_s)$ is not on the finite difference grid site, one must find a set of grid point (i,j,k) sources that are combined to be equivalent to the source located at 1%, in accordance with formula (4) and, $$i_s = int\left(\frac{x_s}{\Delta x}\right), j_s = int\left(\frac{y_s}{\Delta y}\right), \text{ and } k_s = int\left(\frac{z_s}{\Delta z}\right), \quad (6)$$

is the nearest grid point of the (off-grid) source, $\Delta x(\Delta y, \Delta z)$ is the grid step length in x(y,z)-direction, and $w_{i_s+i}(x_s)$, $w_{j_s+j}(y_s)$, and $w_{k_s+j}(z_s)$ are the weighing functions that when combined in a the computer-implemented method are represented by the algorithm:

$$w_{i_s+i}(x_s) = W(x_{i_s+i} - x_s)\frac{\sin\pi(x_{i_s+i} - x_s)}{\pi(x_{i_s+i} - x_s)}, \quad (7)$$

$$W(x) = I_0\left(b\sqrt{1-\left(\frac{x}{\frac{\Delta x}{n_x}}\right)^2}\right)/I_0(b)$$

for a grid point i with coordinate $x_{i_s+i}$ that satisfies $$-n_x/2 + 1 \le \frac{x_{i_s+i} - x_s}{\Delta x} \le n_x/2,$$

where $n_x$ is the window size user input or $n_x$=N/2, half the finite difference order, $I_0$ is the zero-order modified Bessel function, and b=4.31 is the shape control parameter. Similarly one obtains the grid point j and $w_{j_s+j}(y_s)$ in y-direction and k and $w_{k_s+k}(z_s)$ in z-direction. The effective number of the combined point sources is then given $n_x n_y n_z$ in three-dimension, each effective gridpoint sources term is treated as an independent point source with a weight $w_{i_s+i}(x_s)w_{j_s+j}(y_s)$ $w_{k_s+k}(z_s)$. For accuracy consideration, $2n_{(x,y,z)}$ is usually taken the order of the finite difference operator N. Therefore, for the 16$^{th}$-order finite difference, if one takes $n_{x,y,z}$=N/2=8, the number of combined grid point source terms is up to 512. For total number of NS source, the effect number of independent sources is $n_x n_y n_z N_s$;

b) Allocating these $n_x n_y n_z N_s$ effective independent grid-point source grid positions, their weighs and as well as the wavefield variables on the off-chip GPU global memories is represented by the following source code, //allocate the source position on grid point or no on grid points
cudaMalloc((void**)&config→srcpos_shot,
config→NSRC_shot*sizeof(int4));
//Allocate source weight when offset on grid points
cudaMalloc((void**)&config→srcSw8_shot,
config→NSRC_shot*sizeof(float));

c) copying from the CPU memory to the off-chip GPU global memory resource using CUDA copy API having the following source code//copy the point source position from CPU to GPU

```
cudaMemcpy(config->srcpos_shot,&config->srcpos_shot_thread[0],config-
>NSRC_shot*sizeof(int4), cudaMemcpyHostToDevice);
// copy source weigh from CPU to GPU
cudaMemcpy(config->srcSw8_shot,&config->srcSw8_shot_thread[0],config-
>NSRC_shot*sizeof(float),cudaMemcpyHostToDevice) ;
``` d) Mapping those allocated off-chip global memories to texture memories using CUDA API (application programming interface) as represented by the following source code;
cudaBindTexture(0, &d_srcSw8_tex,config→srcSw8, &channelDesc,
nx*ny*nz*config→NREC*sizeof(float));

e) Using CUDA texture memory fetch API to read the independent point source grid positions, and the wavefields $P_{i_s+i,j_s+j,k_s+k}^n$ and the weights $w_{i_s+i}(x_s)w_{j_s+j}(y_s)w_{k_s+k}(z_s)$ on these grid points;

e) Loading or injecting the effective independent grid-point sources with the weights on the wavefields on the grid point $(i_{s+i},j_s+j,k_s+k)$ as represented by the following formula an source code:

$$P_{i_s+i,j_s+j,k_s+k}^n \rightarrow P_{i_s+i,j_s+j,k_s+k}^n + S_{i_s+i,j_s+j,k_s+k}^n. \quad (8)$$

```
// fetch source location
int nslowsrc=tex1Dfetch(d_srcpos_tex,isrc)-RADIUS;
int nmiddlesrc=tex1Dfetch(d_srcpos_tex,1*nsrc+isrc);
int nfastsrc=tex1Dfetch(d_srcpos_tex,2*nsrc+isrc);
int j=tex1Dfetch(d_srcpos_tex,3*nsrc+isrc);
size_t globalAddr= (nslowsrc+RADIUS)*stridemf+ nmiddlesrc*stridef+nfastsrc;
// fetch weighted source
float tmp= tex1Dfetch(src,it*ntsrc+j);
// fetch wavefield
float pp= tex1Dfetch(d_p_tex, globalAddr);
```

```
// inject the wavefield
atomicAdd(&p[globalAddr],pp);
```

3. Retrieving Receiver Wavefields

The sequence of steps for fast wavefield retrieving at arbitrary location in the finite difference method on GPU typically includes:

a) Determining the effective number of the combined grip points for each receiver and calculate the contribution weight. When the receiver $\vec{r}_r$ is not on the finite difference grid site, one must find a set of grid point wavefield terms (i,j,k) that are combined to obtain the wavefield located at $\vec{r}_r$ using formula:

$$R(x_r,y_r,z_r,n)=\Sigma_{(i,j,k)=-n_{x,y,z}/2+1}^{n_{x,y,z}/2} P_{i_r+i,j_r+j,k_r+k}^n w_{i_r+i}(x_r) w_{j_r+j}(y_r) w_{k_r+k}(z_r) \quad (9)$$

Here $n_{x(y,z)}$ is the window size which a person having ordinary skills in the art would recognize typically as $2n_{x(y,z)}=N$ the finite difference order, represented as:

$$i_r = int\left(\frac{x_r}{\Delta x}\right), j_r = int\left(\frac{y_r}{\Delta y}\right), \text{ and } k_r = int\left(\frac{z_r}{\Delta z}\right) \quad (10)$$

Which are the nearest grid point of a (off-grid) receiver, and $w_{i_r+i}(x_r)$, $w_{j_r+j}(y_r)$, and $w_{k_r+k}(z_r)$ are the weighing functions $$w_{i_r+i}(x_r) = W(x_{i_r+i} - x_r) \frac{\sin\pi(x_{i_r+i} - x_r)}{\pi(x_{i_r+i} - x_r)}, \quad (11)$$

$$W(x) = I_0\left(b\sqrt{1-\left(\frac{x}{\frac{\Delta x}{w}}\right)^2}\right) \bigg/ I_0(b)$$

$$\text{for } -n_x/2 + 1 \le \frac{x_{i_r+i} - x_r}{\Delta x} \le n_x/2.$$

Similarly, one calculates $w_{j_r+j}(y_r)$ and $w_{k_r+k}(z_r)$. For total number of $N_r$ receivers, the total number of gridpoints are $n_x n_y n_z N_r$ that are used to obtain the wavefield on the receiver sites;

b) Allocating these $n_x n_y n_z N_r$ grip point positions, weights and as well as the wavefield variables on these grid positions on the off-chip global memories;

c) Mapping those allocate off-chip global memories to texture memories;

d) Using CUDA texture memory fetch API to read the wavefields $P_{i_r+i,j_r+j,k_r+k}^n$ and weights $w_{i_r+i}(x_r)w_{j_r+j}(y_r)w_{k_r+k}(Z_r)$ on these grid points;

e) Summing up the fields $P_{i_r+i,j_r+j,k_r+k}^n$ weighed by $w_{i_r+i}(x_r)w_{j_r+j}(y_r)w_{k_r+k}(z_r)$ to obtain the retrieved wavefield according to the above equation for $R(x_r,y_r,z_r,n)$ on location $(x_r,y_r,z_r)$ at time step n.

f) copying from the off-chip GPU global memory resource to the CPU memory using CUDA copy API.

4. Detailed Description of the Figures

FIG. 1 a cross-sectional view of a portion of the earth over the survey region, 101, in which the preferred embodiment of the present invention is useful. It is important to note, that the survey region 101 of FIG. 1 is a land-based region represented as 102. Persons of ordinary skill in the art, will recognize that seismic survey regions produce detailed images of local geology in order to determine the location and size of possible hydrocarbon (oil and gas) reservoirs, and therefore a well location 103. In these survey regions, sound waves bounce off underground rock formations during blasts at various points of incidence 104, and the waves that reflect back to the surface are captured by seismic data recording sensors, 105, transmitted by data transmission systems, wirelessly, from said sensors, 105, then stored for later processing to a memory resource on a central processing unit, and processed by a central processing unit, and a graphics processing unit, that are typically controlled via a computer system device, having an output device like a display monitor, a keyboard, a mouse, a wireless and wired network card, and a printer connected.

In FIG. 1, the cross-sectional view of a portion of the earth over the survey region is illustrates different types of earth formation, 102, 103, 104, which will comprise the seismic survey data in the present invention. In particular, persons having ordinary skill in the art will soon realize that the present example shows a common midpoint-style gather, where seismic data traces are sorted by surface geometry to approximate a single reflection point in the earth. In this example, data from several shots and receivers may be combined into a single image gather, or used individually depending upon the type of analysis to be performed. Although the present example may illustrate a flat reflector and a respective image gather class, other types or classes of image gathers known in the art maybe used, and its selection may depend upon the presence of various earth conditions or events.

Furthermore, as shown on FIG. 1, the seismic energy from the multiple points of incidence or sources 104, will be reflected from the interface between the different earth formations. These reflections will then be captured by multiple seismic data recording receiving sensors 105, each of which will be placed at different location offsets 110 from each other, and the well 103. Because all points of incidences 104, and all seismic data recording sensors 105 are placed at different offsets 110, the survey seismic data or traces, also known in the art as gathers, will be recorded at various angles of incidence represented by 108. The points of incidence 104 generate downward transmission rays 105, in the earth that are captured by their upward transmission reflection through the recording sensors 105. Well location 103, in this example, is illustrated with an existing drilled well attached to a wellbore, 109, along which multiple measurements are obtained using techniques known in the art. This wellbore 109, is used to obtain source information like wavelets, as well as well log data, that includes P-wave velocity, S-wave velocity, Density, among other seismic data. Other sensors, not depicted in FIG. 1, are placed within the survey region 101 to also capture horizons data information required for interpreters and persons of ordinary skilled in the art to perform various geophysical analysis. In the present example, the gathers will be sorted from field records in order to examine the dependence of amplitude, signal-to noise, move-out, frequency content, phase, and other seismic attributes, on incidence angles 108, offset measurements 110, azimuth, and other geometric attributes that are important for data processing and imaging, and known by persons having ordinary skills in the art.

Although points of incidence, or shots 104, are represented in FIG. 1 as a common-mid-point shot geometry, with shot lines mostly running horizontally, a person having ordinary skills in the art, would soon realize that said pattern could easily be represented in other ways, such as vertically, diagonally or a combination of the three which would in turn produce a different shot geometry. Nevertheless, because of operating conditions, uniform coverage of receiving sensors 105 for uniform acquisition of wavelets, input parameter models, and seismic data as shown in FIG. 1, is usually not achievable over the entire survey area.

Figure 2:
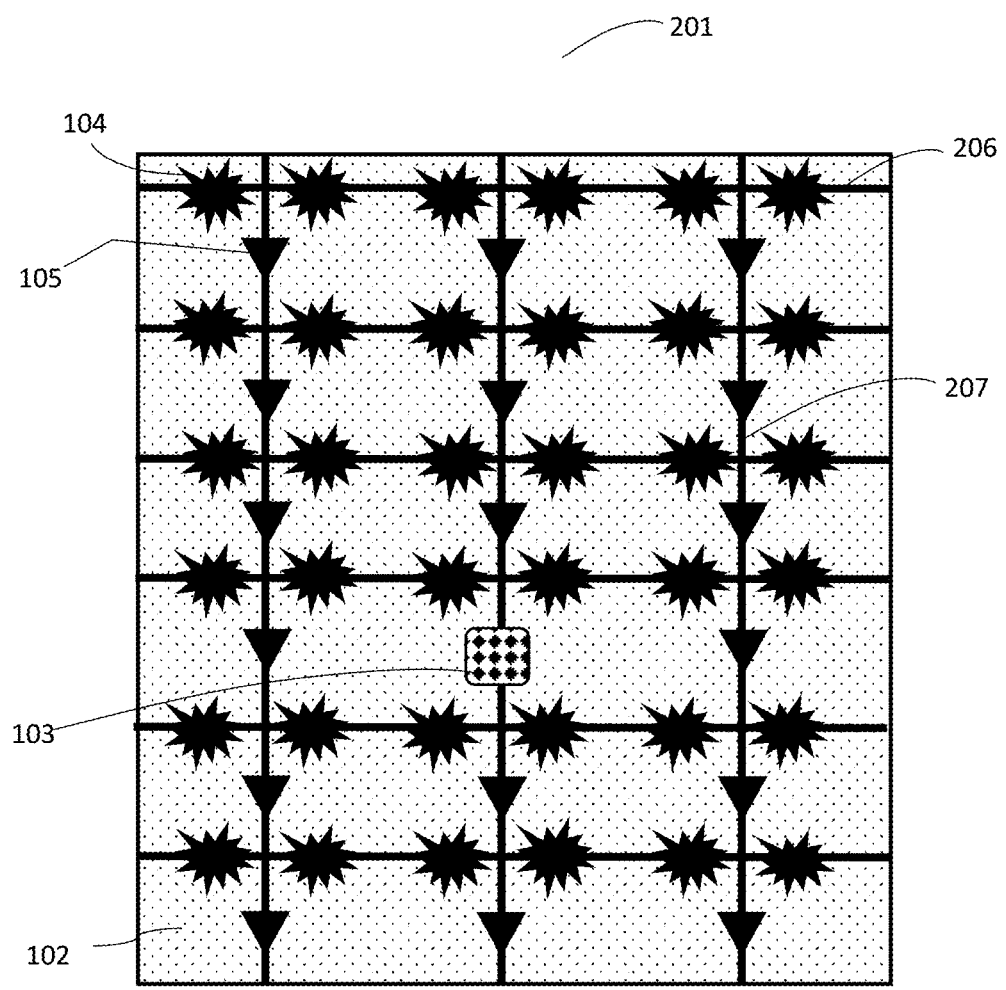
FIG. 2, is a schematic diagram showing top view of a survey region depicting an acquisition geometry with receiver and shot gridpoints and lines, both placed at arbitrary locations on a grid, according to an embodiment of the present disclosure.

As it pertains to FIG. 2, it illustrates a seismic survey region grid 201, in which the preferred embodiment of the present invention is useful. It is important to note, that the grid of FIG. 2 is a land-based region represented as 102 and that a complete survey plan, including swaths of shot located at arbitrary gridpoints (104) and receivers also placed at arbitrary locations (105), may vary depending upon survey characteristics like goals, budget, resource, and time.

Persons of ordinary skill in the art, will recognize that grids like 201 produce detailed images of local geology in order to determine the location and size of possible hydrocarbon (oil and gas) reservoirs, and therefore a potential well location 103. Land acquisition grid geometry represented by FIG. 2 commonly is carried out by swath shooting in which receiver cables are laid out in parallel lines (inline direction) and shots are positioned in a perpendicular direction (crossline direction). In these grids, sound waves bounce off underground rock formations during blasts at various points of incidence or shots 104, and the waves that reflect back to the surface are captured by seismic data recording sensors, 105, transmitted by data transmission systems, wirelessly, from said sensors, 105, then stored for later processing on a central processing unit having memory resource, and then analyzed by a digital high performance computing system having a graphics processing unit, with an off-chip global memory resource, and a texture memory resource. Although shots 104, are represented in FIG. 2 as a cross-spread pattern geometry with shot lines, 206 mostly running horizontally, a person having ordinary skills in the art, would soon realize that said pattern could easily be represented in other ways, such as vertically, diagonally or a combination of the three. Similarly, the recording sensors 105, are placed on receiver lines, 207 shown running across the shot lines 206 but could've also been represented having a different pattern (e.g. diagonally). The swath shooting method yields a wide range of source-receiver azimuths, which can be a concern during analysis by a graphics processing unit. The source-receiver azimuth is the angle between a reference line, such as a receiver line or a dip line, and the line that passes through the source and receiver stations. Nevertheless, because of operating conditions, uniform coverage as shown in FIG. 2, usually is not achievable over the entire survey area.

Figure 3:
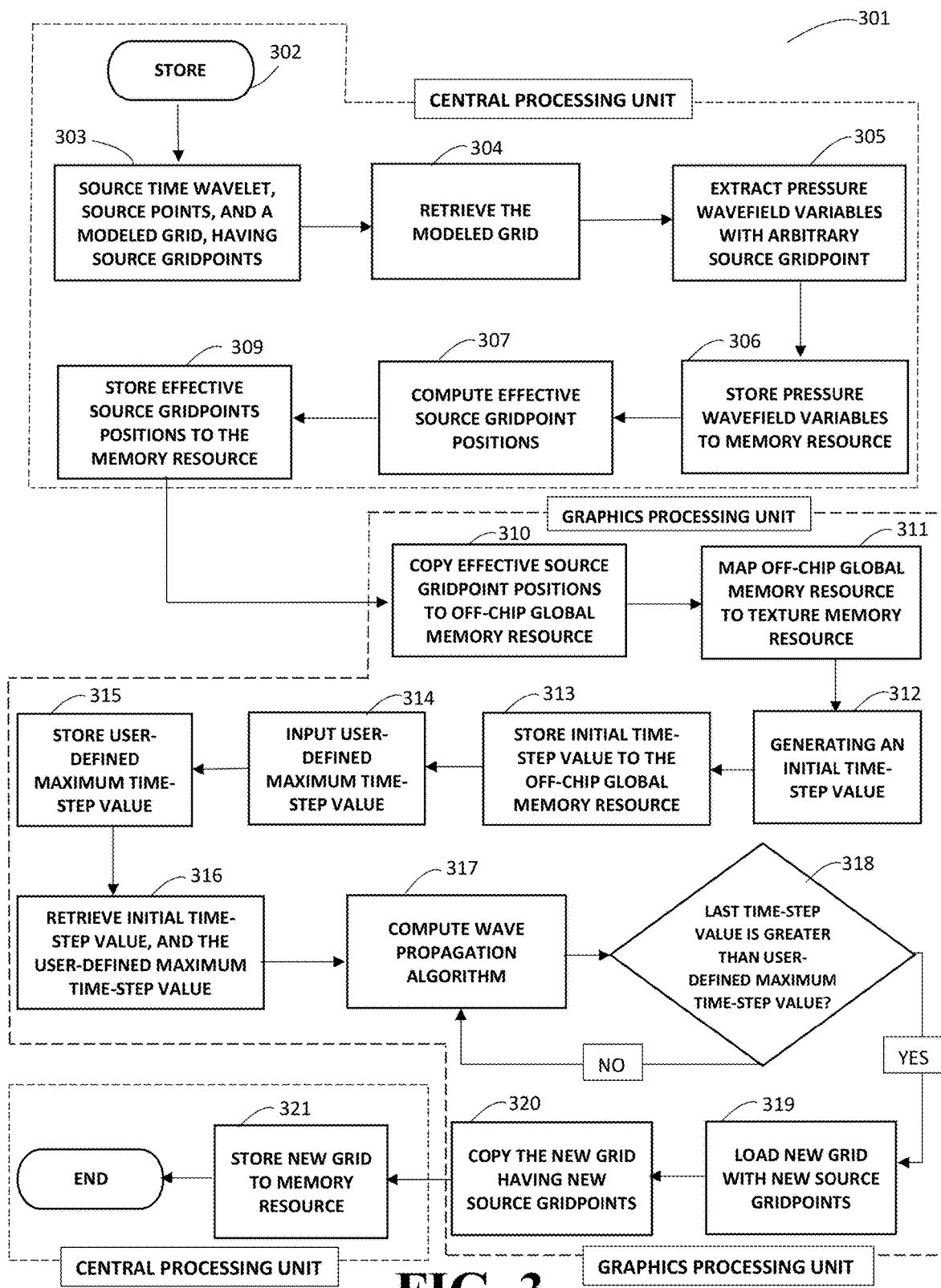
FIG. 3, is a flow chart of the computer-implemented method for high-speed loading source points of incidences locations using a finite difference model, when placed at arbitrary locations on a grid, according to certain embodiments of the present disclosure.

As it pertains to FIG. 3 it illustrates a flow chart of the computer-implemented method for high-speed loading source points of incidences locations using a finite difference model, when placed at arbitrary locations on a grid, according to certain embodiments of the present disclosure. The computer-implemented method 301, using a combination of a central processing unit, and a graphics processing unit both having memory resources for storing certain generated data. In particular, the computer-implemented method 301 is initiated by the central processing unit when, through an external source it receives information that requires storing. Such information is stored to a memory resource of the central processing unit at step 302, and typically comprises a source time wavelet, source points, and a modeled grid, all having source gridpoints placed at arbitrary locations, 303. The way that the central processing unit stores 303 to its memory resource, is by using an acoustic wave velocity model in 3D coordinates. Afterwards, the central processing unit retrieves at 304 from its memory resource, only the modeled grid and begins extracting the pressure wavefield variables with arbitrary source gridpoint positions at 305. The central processing unit then stores at 306 the pressure wavefield variables, and begins computing effective source gridpoint positions for the stored pressure wavefield variables with arbitrary gridpoint positions at 307. The effective source gridpoint position are computed in accordance to an algorithm for the finite difference model, of a gridpoint i with coordinate x that satisfies $$-n_x/2 + 1 \leq \frac{x_{i_s+i} - x_s}{\Delta x} \leq n_x/2,$$

where $n_x$=N/2, (i.e. half the finite difference order). Similarly the algorithm for the finite difference model of a gridpoint j includes the computation of $w_{j_s+j}(y_s)$ in y-direction and in gridpoint k a computation of $w_{k_s+k}(z_s)$ in z-direction. Therefore, the effective number of combined point sources is then given $n_x n_y n_z$ in three-dimension, each effective point sources term treated by the algorithm as an independent point source with a weight $w_{i_s+i}(x_s)w_{j_s+j}(y_s)w_{k_s+k}(z_s)$. For accuracy considerations, step 307 usually takes $2n_{(x,y,z)}$ as the order of the finite difference operator N. Therefore, for the $16^{th}$-order finite difference, they central processing unit at step 307 takes $n_{x,y,z}$=N/2=8, which in turn results in the number of combined gridpoint source terms of up to 512. The central processing unit then stores at 309 the effective source gridpoint positions for the pressure wavefield variables to its memory resource. Upon completion of step 309, the central processing unit sends a message hook to the graphics processing unit, to initiate at step 310, the copying of the stored effective source gridpoint positions for the pressure wavefield variables from the memory resource on the central processing unit, to an off-chip global memory resource located on a graphics processing unit from, using CUDA copy application programming interface. The graphics processing unit then maps its off-chip global memory resource, to its texture memory resource at step 311 using the following map CUDA API:

cudaBindTexture(0, &d_srcSw8_tex,config→srcSw8, &channelDesc, nx*ny*nz*config→NREC*sizeof(float));

Once the mapping step 311 is complete, the graphics processing unit generates at step 312 an initial time-step value which comprise of the minimum values obtained from the source time wavelet, the source points, and the modeled grid all of which contain the following three different variables. These variables are: a) a stability requirement, b) an input data sample interval, and c) an imaging condition interval. The graphics processing unit then stores the initial time-step value to the off-chip global memory resource at 313, and sends a graphics user interface to a display monitor connected to the graphics processing unit, for a user, typically a person having ordinary skills in the art, to input at step 314, a user-defined maximum time-step value. Using the same variables of step 312, the user then defines its maximum time-step value as the minimum of: a) the stability requirement ranging from 0.1 ms to 2 ms, b) the input data sample interval ranging from 1 ms to 4 ms, and c) the imaging condition interval ranging from 2 ms to 8 ms. Upon entering the maximum time-step vale, the user confirms through the graphics user interface which instead signals the graphics processing unit to store the maximum time-step value to its off-chip global memory resource at step 315. The graphics processing unit at step 316 retrieves the initial time-step value, and the user-defined maximum time-step value for it to begin computing at step 317 a wave propagation algorithm, using the effective source gridpoint positions for the pressure wavefield variables, at every inputted time-step value, between the retrieved initial time-step value and the user-defined maximum time-step value. The computation of the wave propagation executed at step 317 is an iterative process, in order to resolve the algorithm presented by formula (1). Iterative step 317 basically uses the proposed efficient computer-implemented method to inject sources that generated the wavefield on the grids, and then propagates them until the last inputted time-step value is equal to the user-defined maximum time-step value. The graphics processing unit will verify at step 318 if the last inputted time-step value is equal to the user-defined maximum time-step value. If it isn't, then the graphics processing unit repeats the computation done at 317 until it exhausts all of the inputted time-step values. At the same time, the graphics processing unit, making use of its parallel processing power, verifies whether the last computation performed at 317 equals the user-defined maximum time-step value, and completes the iterative 317-318 process of wave propagation, and loads or injects at step 319 new source gridpoints onto a newly generated grid having the source pressure wavefield variables at effective. After step 319 is completed, the graphics processing unit begins at step 320 copying to a random access memory device in the central processing unit, the new grid having the new source gridpoints for the pressure wavefield variables at effective positions from each computed wave propagation algorithm, using the CUDA copy application programming interface. Once the graphics processing unit has completed step 321, it sends a signal to the central processing unit to begin storing to its memory resource (typically a hard drive) the new grid having new source gridpoints for the pressure wavefield variables at effective positions from each computed wave propagation algorithm. A graphics user interface is then displayed in the monitor connected to the central processing unit, indicating the user that the computer-implemented method has been completed the first part of the computer-implemented method which comprise of high-speed loading source points of incidences, using a finite difference model, that the final data has been stored, and that is reading to begin the second phase of the computer-implemented method which comprises of high-speed retrieval of receiver locations using a finite difference model. This data can be used for further geophysical and seismic imaging analysis.

Figure 4:
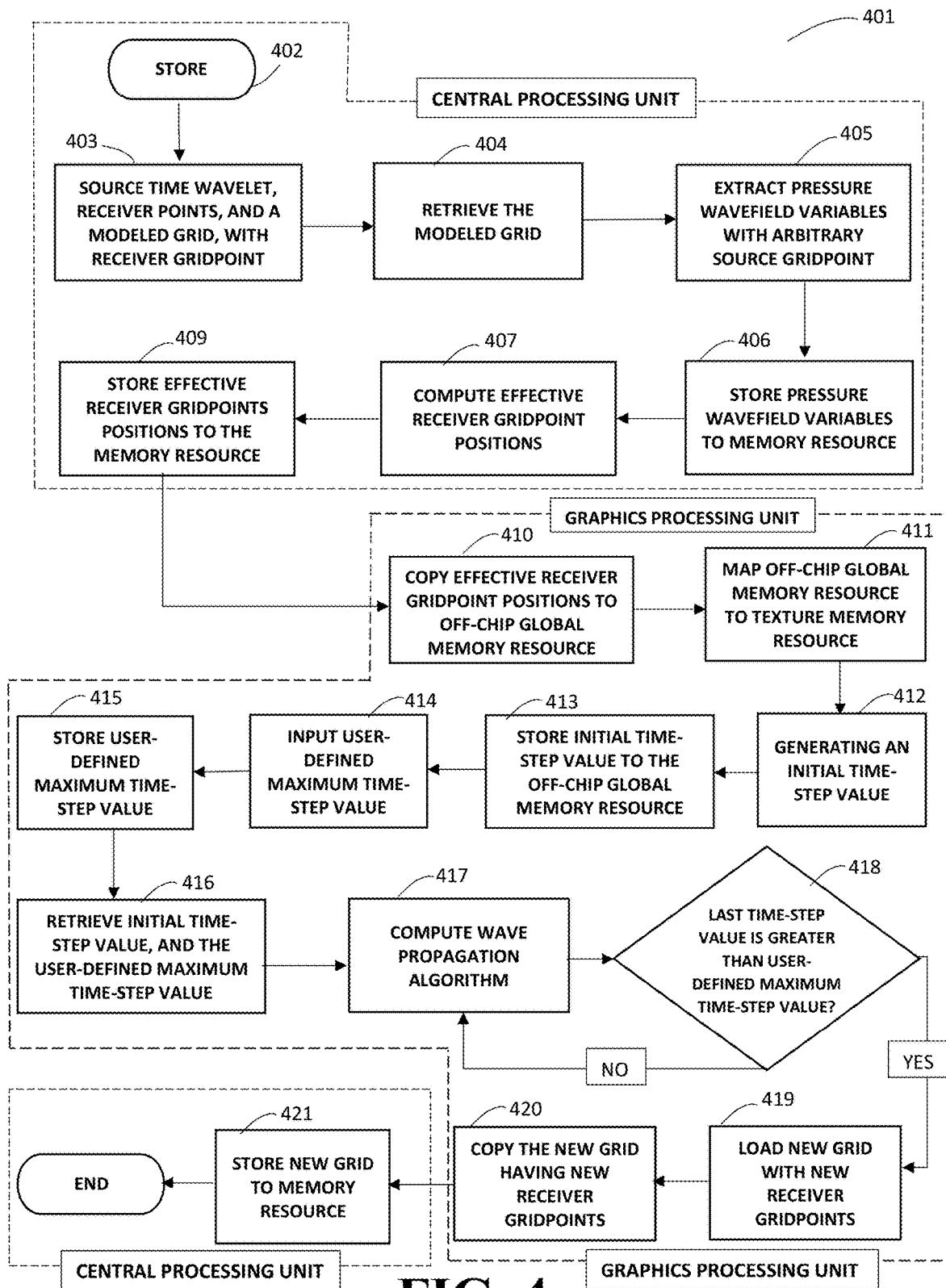
FIG. 4, is a flow chart of the computer-implemented method for high-speed retrieval of receiver locations using a finite difference model, when placed at arbitrary locations on a grid, according to certain embodiments of the present disclosure.

Turning over to FIG. 4, it illustrates the computer-implemented method, for high-speed retrieval of receiver locations using a finite difference model, when placed at arbitrary locations on a grid. The computer-implemented method 401, using a combination of a central processing unit, and a graphics processing unit both having memory resources for storing certain generated data. In particular, the computer-implemented method 401 is initiated by the central processing unit when, through an external source it receives information that requires storing. Such information is stored to a memory resource of the central processing unit at step 402, and typically comprises a source time wavelet, receiver points (sometimes could just be one point), and a modeled grid, all having receiver gridpoints placed at arbitrary locations, 403. The way that the central processing unit stores 403 information to its memory resource, is by using an acoustic wave velocity model in 3D coordinates. Afterwards, the central processing unit retrieves at 404 from its memory resource, only the modeled grid and begins extracting the pressure wavefield variables with arbitrary receiver gridpoint positions at 405. The central processing unit then stores at 406 the pressure wavefield variables, and begins computing effective receiver gridpoint positions for the stored pressure wavefield variables with arbitrary gridpoint positions at 407. The effective receiver gridpoint position are computed in accordance to an algorithm for the finite difference model, of a gridpoint i with coordinate $x_{i_r+i}$ that satisfies $$-n_x/2 + 1 \leq \frac{x_{i_r+i} - x_r}{\Delta x} \leq n_x/2,$$

where $n_x$=N/2, (i.e. half the finite difference order). Similarly the algorithm for the finite difference model of a gridpoint j includes the computation of $w_{j_r+j}(y_r)$ in y-direction and in gridpoint k a computation of $w_{k_r+k}(z_r)$ in z-direction. Therefore, the effective number of combined point receivers is then given $n_x n_y n_z$ in three-dimension, each effective point receivers term treated by the algorithm as an independent point receivers with a weight $w_{i_r+i}(x_r) w_{j_r+j}(y_r) w_{k_r+k}(z_r)$. For accuracy considerations, step 407 usually takes $2n_{(x,y,z)}$ as the order of the finite difference operator N. Therefore, for the $16^{th}$-order finite difference, they central processing unit at step 407 takes $n_{x,y,z}$=N/2=8, which in turn results in the number of combined gridpoint receiver terms of up to 512. The central processing unit then stores at 409 the effective receiver gridpoint positions for the pressure wavefield variables to its memory resource. Upon completion of step 409, the central processing unit sends a message hook to the graphics processing unit, to initiate at step 410, the copying of the stored effective receiver gridpoint positions for the pressure wavefield variables from the memory resource on the central processing unit, to an off-chip global memory resource located on a graphics processing unit from, using CUDA copy application programming interface. The graphics processing unit then maps its off-chip global memory resource, to its texture memory resource at step 411 using the following map CUDA API:

cudaBindTexture(0, &d_srcSw8_tex, config→srcSw8, &channelDesc, nx*ny*nz*config→NREC*sizeof(float));

Once the mapping step 411 is complete, the graphics processing unit generates at step 412 an initial time-step value which comprise of the minimum values obtained from the receiver points, and the modeled grid all of which contain the following three different variables. These variables are: a) a stability requirement, b) an input data sample interval, and c) an imaging condition interval. The graphics processing unit then stores the initial time-step value to the off-chip global memory resource at 413, and sends a graphics user interface to a display monitor connected to the graphics processing unit, for a user, typically a person having ordinary skills in the art, to input at step 414, a user-defined maximum time-step value. Using the same variables of step 412, the user then defines its maximum time-step value as the minimum of: a) the stability requirement ranging from 0.1 ms to 2 ms, b) the input data sample interval ranging from 1 ms to 4 ms, and c) the imaging condition interval ranging from 2 ms to 8 ms. Upon entering the maximum time-step vale, the user confirms through the graphics user interface which instead signals the graphics processing unit to store the maximum time-step value to its off-chip global memory resource at step 415. The graphics processing unit at step 416 retrieves the initial time-step value, and the user-defined maximum time-step value for it to begin computing at step 417 a wave propagation algorithm, using the effective receiver gridpoint positions for the pressure wavefield variables, at every inputted time-step value, between the retrieved initial time-step value and the user-defined maximum time-step value. The computation of the wave propagation executed at step 417 is an iterative process, in order to resolve the algorithm presented by formula (1). Iterative step 417 basically uses the proposed efficient computer-implemented method to retrieve receiver wavefields that are generated on the grids, and then propagates them until the last inputted time-step value is equal to the user-defined maximum time-step value. The graphics processing unit will verify at step 418 if the last inputted time-step value is equal to the user-defined maximum time-step value. If it isn't, then the graphics processing unit repeats the computation done at 417 until it exhausts all of the inputted time-step values. At the same time, the graphics processing unit, making use of its parallel processing power, verifies whether the last computation performed at 417 equals the user-defined maximum time-step value, and completes the iterative 417-418 process of wave propagation, and retrieves at step 419 new receiver gridpoints onto a newly generated grid having the receiver pressure wavefield variables at effective. After step 419 is completed, the graphics processing unit begins at step 420 copying to a random access memory device in the central processing unit, the new grid having the new receiver gridpoints for the pressure wavefield variables at effective positions from each computed wave propagation algorithm, using the CUDA copy application programming interface. Once the graphics processing unit has completed step 421, it sends a signal to the central processing unit to begin storing to its memory resource (typically a hard drive) the new grid having new receiver gridpoints for the pressure wavefield variables at effective positions from each computed wave propagation algorithm. A graphics user interface is then displayed in the monitor connected to the central processing unit, indicating the user that the computer-implemented method has been completed and that the final data has been stored and can be used for further geophysical and seismic imaging analysis.

Figure 5:
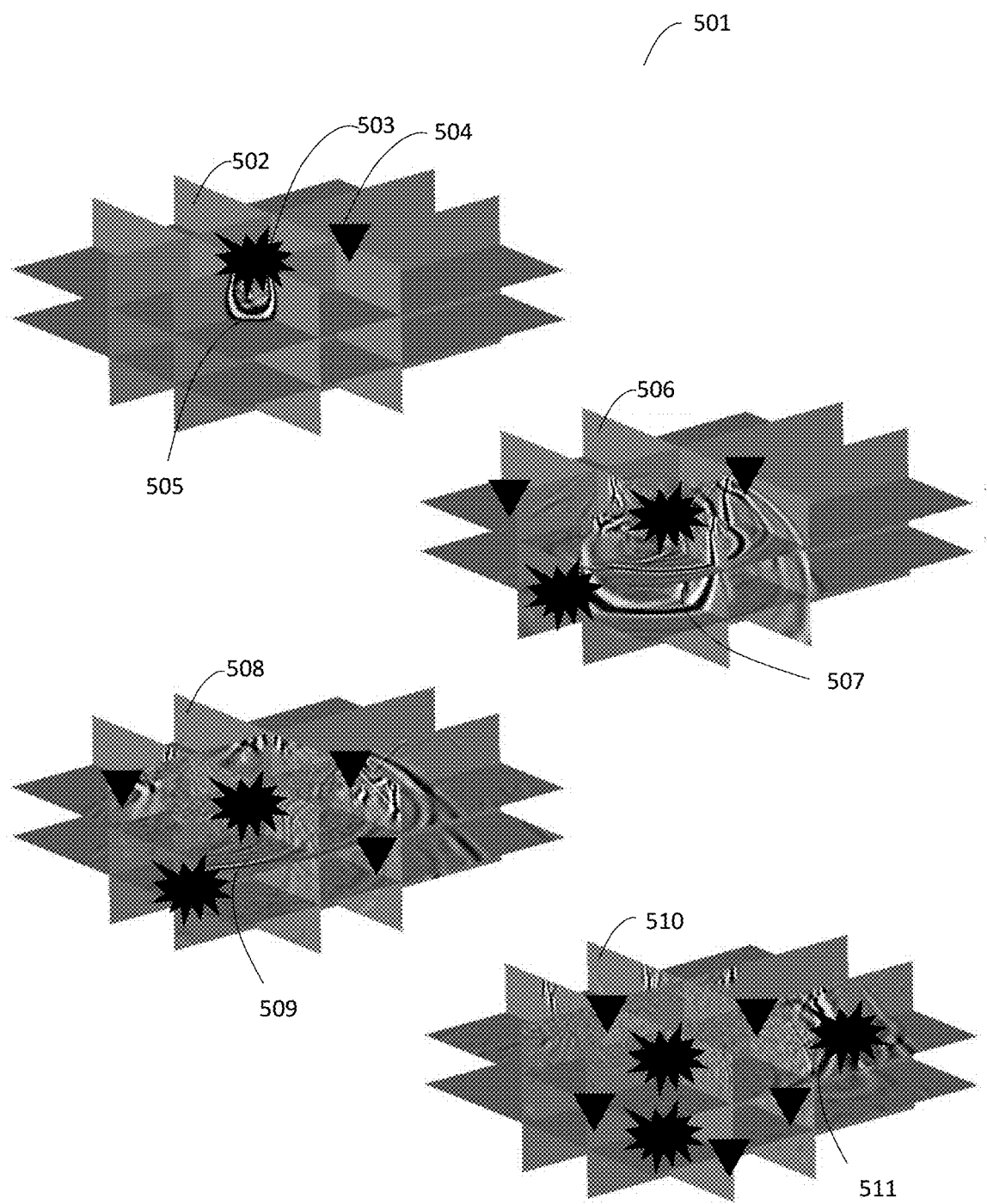
FIG. 5, illustrates a graphic user interface of the computer-implemented method, showing the pressure wavefield at different time-step intervals, with its respective source and receiver point locations, according to certain embodiments of the present disclosure.

As it pertains to FIG. 5, it illustrates graphic user interface of the computer-implemented method, showing the pressure wavefield at different time-step intervals 501, with its respective source and receiver point locations, according to certain embodiments of the present disclosure. In particular, the graphic user interface shows a modeled grid 502, with a source shot or points of incidence 503, a receiver 504 and a pressure wavefield 505 as it is captured by receiver 504 along the earth's subsurface. As the computer-implemented method performs its wave propagations steps from its initial time-step value 506 to its maximum user-defined time step value 510, the graphics processing unit loads or injects sources (represented in FIG. 5 by explosion symbols) otherwise off-the-grid, into the grid, as well as retrieves receiver gridpoints (represented in FIG. 5 by inverted triangles) also otherwise off-the-grid, into the grid, resulting in a clear and precise wave propagations as represented by 507, 509 and 511.

According the preferred embodiment of the present invention, certain hardware, and software descriptions were detailed, merely as example embodiments and are not to limit the structure of implementation of the disclosed embodiments. For example, although many internal, and external components of the central processing unit, and of the graphics processing unit have been described, those with ordinary skills in the art will appreciate that such components and their interconnection are well known. Additionally, certain aspects of the disclosed invention may be embodied in software that is executed using one or more, receiving systems, memory resources, central processing units, graphics processing units, or non-transitory computer readable memory devices.

Computer programs, or codes of the technology of the present invention may be thought of as "products" or "articles of manufacture" typically in the form of executable code and/or associated data that is carried on, or embodied in, a type of machine readable medium.

Tangible non-transitory "storage" type media and devices include any or all memory or other storage for the computers, process or the like, or associated modules thereof such as various semiconductor memories, tape drives, disk drives, optical or magnetic disks, and the like which may provide storage at any time for the software programming.

As used herein the term "survey region" refers to an area or volume of geologic interest, and may be associated with the geometry, attitude and arrangement of the area or volume at any measurement scale. A region may have characteristics such as folding, faulting, cooling, unloading, and/or fracturing that has occurred therein.

As used herein, the term "computing" encompasses a wide variety of actions, including calculating, determining, processing, deriving, investigation, look ups (e.g. looking up in a table, a database, or another data structure), ascertaining and the like. It may also include receiving (e.g. receiving information), accessing (e.g. accessing data in a memory) and the like. Also, "computing" may include resolving, selecting, choosing, establishing, and the like.

As used herein, "subsurface", and "subterranean" means beneath the top surface of any mass of land at any elevation or over a range of elevations, whether above, below or at sea level, and/or beneath the floor surface of any mass of water, whether above, below or at sea level.

Unless specifically stated otherwise, terms such as "defining", "creating", "including", "representing", "pre-analyzing", "pre-defining", "choosing", "building", "assigning", "creating", "introducing", "eliminating", "re-meshing", "integrating", "discovering", "performing", "predicting", "determining", "inputting", "outputting", "identifying", "analyzing", "using", "assigning", "disturbing", "increasing", "adjusting", "incorporating", "simulating", "decreasing", "distributing", "specifying", "extracting", "displaying", "executing", "implementing", and "managing", or the like, may refer to the action and processes of a retrieving system, or other electronic device, that transforms data represented as physical (electronic, magnetic, or optical) quantities within some electrical device's storage, like memory resources, or non-transitory computer readable memory, into other data similarly represented as physical quantities within the storage, or in transmission or display devices.

Embodiments disclosed herein also relate to computer-implemented system, used as part of the retrieving system for performing the operations herein. This system may be specially constructed for the required purposes, or it may comprise a general-purpose computer selectively activated or reconfigured by a computer program or code stored in the memory resources, or non-transitory computer readable memory. As such, the computer program or code may be stored or encoded in a computer readable medium or implemented over some type of transmission medium. A computer-readable medium, or a memory resource includes any medium or mechanism for storing or transmitting information in a form readable by a machine, such as a computer ('machine' and computer may be used synonymously herein). As a non-limiting example, a computer-readable medium or a memory resource may include a computer-readable storage medium (e.g., read only memory ("ROM"), random access memory ("RAM"), magnetic disk storage media, optical storage media, flash memory devices, etc.). A transmission medium may be twisted wire pairs, coaxial cable, optical fiber, or some other suitable wired or wireless transmission medium, for transmitting signals such as electrical, optical, acoustical, or other form of propagated signals (e.g., carrier waves, infrared signals, digital signals, etc.).

A receiving system or sensor 105 as used herein, typically includes at least hardware capable of executing machine readable instructions, as well as the software for executing acts (typically machine-readable instructions) that produce a desired result. In addition, a retrieving system may include hybrids of hardware and software, as well as computer sub-systems.

Hardware generally includes at least processor-capable platforms, such as client-machines (also known as servers), and hand-held processing devices (for example smart phones, personal digital assistants (PDAs), or personal computing devices (PCDs)). Further, hardware may include any physical device that can store machine-readable instructions, such as memory or other data storage devices. Other forms of hardware include hardware sub-systems, including transfer devices such as modems, modem cards, ports, and port cards, for example.

Software includes any machine code stored in any memory medium, such as RAM or ROM, and machine code stored on other devices (such as non-transitory computer readable media like external hard drives, or flash memory, for example). Software may include source or object code, encompassing any set of instructions capable of being executed in a client machine, server machine, remote desktop, or terminal.

Combinations of software and hardware could also be used for providing enhanced functionality and performance for certain embodiments of the disclosed invention. One example is to directly manufacture software functions into a silicon chip. Accordingly, it should be understood that combinations of hardware and software are also included within the definition of a retrieving system and are thus envisioned by the invention as possible equivalent structures and equivalent methods.

Computer-readable mediums or memory resources include passive data storage, such as a random-access memory (RAM) as well as semi-permanent data storage such as external hard drives, and external databases, for example. In addition, an embodiment of the invention may be embodied in the RAM of a computer to transform a standard computer into a new specific computing machine.

Data structures are defined organizations of data that may enable an embodiment of the invention. For example, a data structure may provide an organization of data, or an organization of executable code. Data signals could be carried across non-transitory transmission mediums and stored and transported across various data structures, and, thus, may be used to transport an embodiment of the invention.

The system computer may be designed to work on any specific architecture. For example, the system may be executed on a high-performance computing system, which typically comprise the aggregation of multiple single computers, physically connected, or connected over local area networks, client-server networks, wide area networks, internets, hand-held and other portable and wireless devices, and networks.

An "output device" includes the direct act that causes generating, as well as any indirect act that facilitates generation. Indirect acts include providing software to a user, maintaining a website through which a user is enabled to affect a display, hyperlinking to such a website, or cooperating or partnering with an entity who performs such direct or indirect acts. Thus, a user may operate alone or in cooperation with a third-party vendor to enable the reference signal to be generated on a display device. A display device may be included as an output device, and shall be suitable for displaying the required information, such as without limitation a CRT monitor, an LCD monitor, a plasma device, a flat panel device, or printer. The display device may include a device which has been calibrated through the use of any conventional software intended to be used in evaluating, correcting, and/or improving display results (e.g., a color monitor that has been adjusted using monitor calibration software). Rather than (or in addition to) displaying the reference image on a display device, a method, consistent with the invention, may include providing a reference image to a subject. "Providing a reference image" may include creating or distributing the reference image to the subject by physical, telephonic, or electronic delivery, providing access over a network to the reference, or creating or distributing software to the subject configured to run on the subject's workstation or computer including the reference image. In one example, providing of the reference image could involve enabling the subject to obtain the reference image in hard copy form via a printer.

For example, information, software, and/or instructions could be transmitted (e.g., electronically or physically via a data storage device or hard copy) and/or otherwise made available (e.g., via a network) in order to facilitate the subject using a printer to print a hard copy form of reference image. In such an example, the printer may be a printer which has been calibrated through the use of any conventional software intended to be used in evaluating, correcting, and/or improving printing results (e.g., a color printer that has been adjusted using color correction software).

A database, or multiple databases may comprise any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across a local network, a wireless network of the Internet.

Furthermore, modules, features, attributes, methodologies, and other aspects can be implemented as software, hardware, firmware, or any combination thereof. Wherever a component of the invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the invention is not limited to implementation in any specific operating system or environment.

Various terms as used herein are defined below. To the extent a term used in a claim is not defined below, it should be given the broadest possible definition persons in the pertinent art have given that term as reflected in at least one printed publication or issued patent.

As used herein, "and/or" placed between a first entity and a second entity means one of (1) the first entity, (2) the second entity, and (3) the first entity and the second entity. Multiple elements listed with "and/or" should be construed in the same fashion, i.e., "one or more" of the elements so conjoined Additionally, the flowcharts and block diagrams in the Figures illustrate the architecture, functionality, and operation of possible implementations of systems, methods, and computer program products according to various embodiments of the present disclosure. It should also be noted that, in some alternative implementations, the functions noted in the block may occur out of the order noted in the Figures. For examples, two blocks shown in succession may, in fact, be executed substantially concurrently, or the blocks may sometimes be executed in the reverse order, depending upon the functionality involved. It will also be noted that each block of the block diagrams and/or flowcharts illustration, and combinations of blocks in the block diagrams and/or flowchart illustration, can be implemented by special purpose hardware-based systems that perform the specified hardware functions or acts, or combinations of special purpose hardware and computer instructions.

While in the foregoing specification this disclosure has been described in relation to certain preferred embodiments thereof, and many details have been set forth for purpose of illustration, the invention is not to be unduly limited to the foregoing which has been set forth for illustrative purposes. On the contrary, a wide variety of modifications and alternative embodiments will be apparent to a person skilled in the art, without departing from the true scope of the invention, as defined in the claims set forth below. Additionally, it should be appreciated that structural features or method steps shown or described in any one embodiment herein can be used in other embodiments as well.

What is claimed is:

1. A computer-implemented method for high-speed loading source points of incidences using a finite difference model, when placed at arbitrary locations on a grid, the method comprising:

storing a source time wavelet, source points, and a modeled grid, having source gridpoints placed at arbitrary locations, using an acoustic wave velocity model in 3D coordinates, to a memory resource on a central processing unit;

retrieving the modeled grid from the memory resource by the central processing unit;

extracting pressure wavefield variables with arbitrary source gridpoint positions from the retrieved modeled grid by the central processing unit;

storing the extracted pressure wavefield variables with arbitrary source gridpoint positions to the memory resource on the central processing unit;

computing effective source gridpoint positions for the stored pressure wavefield variables with arbitrary gridpoint positions by the central processing unit;

storing the computed effective source gridpoint positions for the pressure wavefield variables to the memory resource on the central processing unit;

copying the stored effective source gridpoint positions for the pressure wavefield variables from the memory resource on the central processing unit to an off-chip global memory resource located on a graphics processing unit using a CUDA copy application programming interface;

mapping the off-chip global memory resource of the graphic processing unit to a texture memory resource of the graphics processing unit;

generating an initial time-step value by the graphics processing unit;

storing the generated initial time-step value to the off-chip global memory resource of the graphics processing unit;

inputting to the graphics processing a user-defined maximum time-step value to the graphics processing unit;

storing the inputted user-defined maximum time-step value to the off-chip global memory resource of the graphics processing unit;

retrieving the initial time-step value and the user-defined maximum time-step value from the off-chip global memory resource of the graphics processing unit;

computing, by the graphics processing unit, a wave propagation algorithm using the copied effective source gridpoint positions for the pressure wavefield variables at every inputted time-step value, between the retrieved initial time-step value and the user-defined maximum time-step value;

repeating the step of computing the wave propagation algorithm by the graphics processing unit until the last inputted time-step value is equal to the user-defined maximum tune-step value;

loading, by the graphics processing unit, a new modeled grid having new source gridpoints for the pressure wavefield variables at effective positions from each computed wave propagation algorithm;

copying from the graphics processing unit to the central processing unit the new grid having new source gridpoints for the pressure wavefield variables at effective positions from each computed wave propagation algorithm using the CUDA copy application programming interface; and storing to the memory resource of the central processing unit the copied new grid having new source gridpoints for the pressure wavefield variables at effective positions from each computed wave propagation algorithm.

2. The computer-implemented method of claim 1, wherein the step of storing the source time wavelet, the source points, and the modeled grid further comprises a source wavelet represented in time domain by the expression: s(t).

3. The computer-implemented method of claim 2, wherein the step of storing the source time wavelet, the source points, and the modeled grid further comprises individual source points represented by the expression: $\vec{r}_s=(x_s,y_s,z_s)$, wherein $\vec{r}_s$ represents a source point at the coordinates of $(x_s,y_s,z_s)$.

4. The computer-implemented method of claim 3, wherein the step of storing the source time wavelet, the source points, and the modeled grid further comprises the acoustic wave velocity model represented by the expression: $V_P$.

5. The computer-implemented method of claim 4, wherein, in the step of extracting pressure wavefield variables with arbitrary source gridpoint positions, the pressure wavefield at $(\vec{r},t)$ due to the point excitation at $\vec{r}_s$ is $P(\vec{r},\vec{r}_s;t)$.

6. The computer-implemented method of claim 5, wherein the step of computing effective source gridpoint positions for the stored pressure wavefield variables with arbitrary grid point positions, further comprises of up to 512 gridpoint positions for each off-gridpoint source.

7. The computer-implemented method of claim 6, wherein the step of computing effective source gridpoint positions for the stored pressure wavefield variables with arbitrary grid point positions, by the central processing unit, further comprises of assigning a weight to each gridpoint position represented by the expression:

$S_{i_s+i,j_s+j,k_s+k}{}^n(x_s,y_s,z_s)=s(t)w_{i_s+i}(x_s)w_{j_s+j}(y_s)w_{k_s+k}(z_s)$, wherein $$i_s = \text{int}\left(\frac{x_s}{\Delta x}\right), i_s = \text{int}\left(\frac{y_s}{\Delta y}\right), \text{ and } k_s = \text{int}\left(\frac{z_s}{\Delta z}\right),$$

and $w_{i_s+i}(x_s)$, $w_{j_s+j}(y_s)$, and $w_{k_s+k}(z_s)$ are the nearest gridpoints for any off-grid source, $w_{i_s+i}(x_s)$, $w_{j_s+j}(y_s)$, and $w_{k_s+k}(z_s)$ are the weighing functions, and $\Delta x(\Delta y,\Delta z)$ is the grid step in x(y,z)-direction.

8. The computer-implemented method of claim 7, wherein the step of inputting to the graphics processing the user-defined maximum time-step value to the graphics processing unit further comprises as the minimum of a stability requirement ranging from 0.1 ms to 2 ms, an input data sample interval ranging from 1 ms to 4 ms, and an imaging condition interval ranging from 2 ms to 8 ms.

9. The computer-implemented method of claim 8, wherein the step of computing by the graphics processing unit, the wave propagation algorithm further comprises computing according to the expression:

$$\frac{1}{V_P^2}\frac{\partial^2 P(\vec{r},\vec{r}_s;t)}{\partial t^2} = \nabla^2 P(\vec{r},\vec{r}_s;t) + s(t)\delta(\vec{r}-\vec{r}_s).$$

10. The computer-implemented method of claim 1, wherein the step of loading by the graphics processing unit a new grid having new source gridpoints for the pressure wavefield variables at effective positions from each computed wave propagation algorithm comprises computing the source loading at the source location at $(i_s,j_s,k_s)$ at time-step value n according to the expression:

$P_{i_s+i,j_s+j,k_s+k}{}^n \to P_{i_s+i,j_s+j,k_s+k}{}^n + S_{i_s+i,j_s+j,k_s+k}{}^n$.

11. A computer-implemented method for high-speed retrieval of receiver wavefield locations using a finite difference model, when placed at arbitrary locations on a grid, the method comprising:

storing a source time wavelet, receiver locations, and a modeled grid, having receiver gridpoints placed at arbitrary locations, using an acoustic wave velocity model in 3D coordinates; to a memory resource on a central processing unit;

retrieving the modeled grid from the memory resource by the central processing unit;

extracting receiver pressure wavefield variables with arbitrary receiver gridpoint positions from the retrieved modeled grid by the central processing unit;

storing the extracted receiver pressure wavefield variables with arbitrary receiver gridpoint positions to the memory resource on the central processing unit;

computing effective receiver gridpoint positions for the stored receiver pressure wavefield variables with arbitrary gridpoint positions by the central processing unit;

storing the computed effective receiver gridpoint positions for the receiver pressure wavefield variables to the memory resource on the central processing unit;

copying the stored effective receiver gridpoint positions for the receiver pressure wavefield variables from the memory resource on the central processing unit to an off-chip global memory resource located on a graphics processing unit using a CUDA copy application programming interface;

mapping the off-chip global memory resource of the graphic processing unit to a texture memory resource of the graphics processing unit;

generating an initial time-step value by the graphics processing unit;

storing the generated initial time-step value to the off-chip global memory resource of the graphics processing unit;

inputting to the graphics processing a user-defined maximum time-step value to the graphics processing unit;

storing the inputted user-defined maximum time-step value to the off-chip global memory resource of the graphics processing unit;

retrieving the initial time-step value and the user-defined maximum time-step value from the off-chip global memory resource of the graphics processing unit;

computing by the graphics processing unit, a wave propagation algorithm using the copied effective receiver gridpoint positions for the receiver pressure wavefield variables at every inputted time-step value, between the retrieved initial time-step value and the user-defined maximum time-step value;

repeating the step of computing the wave propagation algorithm by the graphics processing unit until the last inputted time-step value is equal to the user-defined maximum time-step value;

loading, by the graphics processing unit, a new grid having new modeled receiver gridpoints for the receiver pressure wavefield variables at effective positions from each computed wave propagation algorithm;

copying from the graphics processing unit to the central processing unit the new grid having new receiver gridpoints for the receiver pressure wavefield variables at effective positions from each computed wave propagation algorithm using the CUDA copy application programming interface; and storing to the memory resource of the central processing unit the copied new grid having new receiver gridpoints for the receiver pressure wavefield variables at effective positions from each computed wave propagation algorithm.

12. The computer-implemented method of claim 11, wherein the step of storing the receiver locations, and flail the modeled grid, having the receiver gridpoints placed at arbitrary locations further comprises individual receiver points represented by the expression: $\vec{r}_r = (x_r, y_r, z_r)$, wherein $\vec{r}_r$ represents a receiver location at the coordinates of $(x_r, y_r, z_r)$.

13. The computer-implemented method of claim 12, wherein the step of storing the receiver locations, and the modeled grid having receiver gridpoints placed at arbitrary locations further comprises the acoustic wave velocity model represented by the expression: $V_P$.

14. The computer-implemented method of claim 13, wherein the step of extracting receiver pressure wavefield variables with arbitrary source gridpoint positions further comprises computing the wavefield at time step n at $(i_r+i, j_r+j, k_r+k)$ having the expression $P_{i_r+i,j_r+j,k_r+k}^n$.

15. The computer-implemented method of claim 14, wherein the step of computing effective receiver gridpoint positions for the stored receiver pressure wavefield variables with arbitrary grid point positions further comprises of up to 512 gridpoint positions for each off-gridpoint source.

16. The computer-implemented method of claim 15, wherein the step of inputting to the graphics processing the user-defined maximum time-step value to the graphics processing unit further comprises as the minimum of a stability requirement ranging from 0.1 ms to 2 ms, an input data sample interval ranging from 1 ms to 4 ms, and an imaging condition interval ranging from 2 ms to 8 ms.

17. The computer-implemented method of claim 15, wherein the step of loading by the graphics processing unit a new grid having new receiver gridpoints for the receiver pressure wavefield variables at effective positions from each computed wave propagation algorithm comprising: computing a wavefield at time step n recorded by the receiver located at $(x_r, y_r, z_r)$ according to the expression:

$$R(x_r, y_r, z_r, n) = \sum_{(i,j,k)=-n_{x,y,z}/2+1}^{n_{x,y,z}/2} P_{i_r+i,j_r+j,k_r+k}^n w_{i_r+i}(x_r) w_{j_r+j}(y_r) w_{k_r+k}(z_r),$$

wherein $w_{i_r+i}(x_r)$, $w_{j_r+j}(y_r)$, and $w_{k_r+k}(z_r)$ are weighing functions.

* * * * *